United States Patent [19]

Kojima

[11] Patent Number: 4,862,118
[45] Date of Patent: Aug. 29, 1989

[54] SIGNAL PROCESSING SYSTEM USING A COMPRESSOR AND AN EXPANDER

[75] Inventor: Masanori Kojima, Nagaokakyo, Japan

[73] Assignee: Mitsubishi Denki Kabushiki Kaisha, Tokyo, Japan

[21] Appl. No.: 105,288

[22] Filed: Oct. 7, 1987

[30] Foreign Application Priority Data

Oct. 13, 1986 [JP] Japan ................. 61-243607

[51] Int. Cl.$^4$ .......................... H04B 1/64; H03G 7/00
[52] U.S. Cl. ........................................ 333/14; 330/279; 381/106
[58] Field of Search ................. 333/14; 330/126, 136, 330/144, 149, 279; 381/106

[56] References Cited

U.S. PATENT DOCUMENTS

| | | | |
|---|---|---|---|
| 3,789,143 | 1/1974 | Blackmer | 333/14 X |
| 4,114,115 | 9/1978 | Minnis | 333/14 |
| 4,281,295 | 7/1981 | Nishimura et al. | 333/14 |
| 4,449,106 | 5/1984 | Ishigaki et al. | 333/14 |
| 4,521,138 | 6/1985 | Akagiri et al. | 333/14 X |
| 4,683,449 | 7/1987 | Kato | 333/14 |

FOREIGN PATENT DOCUMENTS

| | | | |
|---|---|---|---|
| 3111605 | 3/1982 | Fed. Rep. of Germany. | |
| 3134295 | 4/1982 | Fed. Rep. of Germany. | |
| 33609 | 3/1978 | Japan | 333/14 |
| 44338 | 3/1982 | Japan | 333/14 |
| 11723310 | 11/1969 | United Kingdom. | |
| 1190763 | 5/1970 | United Kingdom. | |

OTHER PUBLICATIONS

Video Recording and Playback Systems-Beta Hi-Fi VCR, published in Aug., 1983.

Primary Examiner—Eugene R. LaRoche
Assistant Examiner—Benny Lee
Attorney, Agent, or Firm—Oblon, Spivak, McClelland, Maier & Neustadt

[57] ABSTRACT

In a signal processing system used for recording and reproducing acoustic signals, a compressor comprises a first detector for detecting an output signal from an amplifier by a first time constant, a second detector for detecting the output signal from the amplifier by a second time constant which is shorter than the first time constant, a threshold means for detecting a signal from the second detector to output a signal component exceeding a threshold level, and a combining means for combining signals from both the first detector and the threshold to thereby generate an output to the amplifier. An expander in the signal processing system comprises a first detector for detecting an input signal to be inputted into an amplifier by a first time constant, a second detector for detecting the input signal to the amplifier by a second time constant which is shorter than the first time constant, a threshold means for detecting a signal from the second detector to output a signal component exceeding a threshold level, and a combining means for combining signals from both the first detector and the threshold means to thereby generate a signal to the amplifier.

15 Claims, 4 Drawing Sheets

SIGNAL PROCESSING SYSTEM USING A COMPRESSOR AND AN EXPANDER

BACKGROUND OF THE INVENTION

Field of the Invention

The present invention relates to a signal processing system having a compressor for supplying an output signal which is formed by compressing the dynamic range of an input signal to a load such as a tape recorder, or that having an expander for expanding the dynamic range of a reproducing signal generated from the load.

Discussion of Background

FIG. 1 shows an apparatus which improves a dynamic range in a sound signal when it is recorded or reproduced by a tape recorder or a similar device. In FIG. 1, a reference numeral 1 designates an input signal source, 2 designates a voltage controlled amplifier and a numeral 3 designates a first detector, all of which constitute a compressor 7. A reference numeral 4 designates a load which may be a tape recorder. A reference numeral 5 designates a voltage controlled amplifier and a numeral 6 designates a detector, these constituting an expander 8.

In a signal processing system shown in FIG. 1, an input signal generated from the input signal source 1 is supplied to the voltage controlled amplifier 2 which is so adapted that the amplification factor is changed in inverse proportion to the output of the detector 3. The detector 3 receives the output of the voltage controlled amplifier 2 to produce a direct current voltage in proportion to the output.

When the level of the output signal of the compressor 7 is determined to be a value designated as B and the level of the input signal is a value designated as A, there is a relation of B ∝ A/B, hence B ∝ √A since the amplification factor of the voltage controlled amplifier 2 is in inverse proportion to the level B. Accordingly, the dynamic range of the input signal has a value of compression of ½ in terms of decibel(dB). The compressed signal is supplied to the tape recorder 4 for sound recording. Then, the recorded signal is expanded by the expander 8 for reproduction of sound. The function of the expander is in a complementary relation to the function of the compressor. Namely, a reproducing signal from the tape recorder 4 is received in the voltage controlled amplifier 5 while the signal is detected by the detector 6 whereby the detected signal controls the voltage controlled amplifier 5. The amplification factor of the amplifier 5 is changed in proportion to a direct current output voltage generated from the detector 6. On the other hand, the detector 6 has properties equivalent to the detector 3 and converts the reproducing output of the tape recorder 4 into a direct current voltage signal.

When the level of the reproducing output signal of the tape recorder 4 is determined to be a value designated as C and the output level of the expander 8 is a value designated as D, there is a relation of D ∝ C² since the amplification factor of the voltage controlled amplifier 5 is in proportion to C. Namely, the dynamic range of the reproducing signal is expanded double in terms of decibel(dB). Thus, the dynamic range of the tape recorder 4 is effectively expanded, and reproduced sound can be obtained without impairing a broad dynamic range of the input signal from the input signal source 1. In this case, since noises caused by, for instance, running of a magnetic tape is reduced to a small level by the function of the expander 8, an input signal such as a pianissimo can be reproduced without suffering the masking of tape noises.

However, in the conventional system as described above, it is necessary for the first detector 3 to have an integration time constant (a first time constant) of several milli-seconds. Accordingly, when an input signal level suddenly rises, the output of the detector 3 is slowly increased depending on the first time constant even though the output of the voltage controlled amplifier 2 suddenly increases, whereby there is some delay in controlling the amplification factor of the voltage controlled amplifier 2. For instance, when the input signal from the input signal source 1 assumes a form of tone-burst as shown in FIG. 2a, the output of the detector 3 begins rising at the first time constant as soon as the tone-burst signal rises as shown in FIG. 2b. Accordingly, the output of the voltage controlled amplifier 2 is not compressed at the rising portion of the signal as shown in FIG. 2c. The output signal at the rising part exceeds the dynamic range of the tape recorder 4 with the result that there cause problems of increase in sound strain, omission of minute sound, generation of click noises and so on. These require an additional dynamic range for the tape recorder 4.

It is an object of the present invention to provide a signal processing system having a compressor capable of avoiding occurrence of an abnormal operation due to delay in the operation of a first detecting means.

It is an object of the present invention to provide a signal processing system which faithfully reproduces signals recorded in a compressed form by the compressor.

The present invention is to provide a signal processing system comprising a load and a compressor for compressing the dynamic range of an input signal to supply a compressed signal to said load, wherein said compressor comprises:

(a) an amplifying means for amplifying said input signal, (b) a first detecting means for receiving an output signal from said amplifying means to detect the output signal by a first time constant, (c) a second detecting means including a threshold means which detects said output signal from said amplifying means by a second time constant which is shorter than said first time constant, said threshold means being adapted to output a signal exceeding a threshold level, and (d) a combining means for combining signals outputted from both said first and second detecting means to output a composite signal to said amplifying means, whereby amplification factor in said amplifying means is changed.

Further, the present invention is to provide a signal processing system comprising a load and an expander for expanding the dynamic range of an input signal outputted from said load, wherein said expander comprises:

(a) an amplifying means for amplifying said input signal, (b) a first detecting means for receiving said input signal to detect the same by a first time constant, (c) a second detecting means including a threshold means which detects said input signal by a second time constant which is shorter than said first time constant, said threshold means being adapted to output a signal exceeding a threshold level, and (d) a combining means for combining signals outputted from both said first and second detecting means to output a composite signal to said amplifying means, whereby amplification factor in said amplifying means is changed.

As a modification of the present invention, the compressor may be provided with the first detecting means for detecting an input signal to be inputted in the amplifying means by the first time constant, the second detecting means including the threshold means which detects the input signal by the second time constant which is shorter than the first time constant and the combining means for combining signals from both the first and second detecting means.

As another modification of the present invention, the expander comprises the first detecting means for detecting an output signal from the amplifying means by the first time constant, the second detecting means including the threshold means which detects the output signal by the second time constant which is shorter than the first time constant, and the combining means for combining signals from the first and second detecting means. In the drawings.

Figure 3:
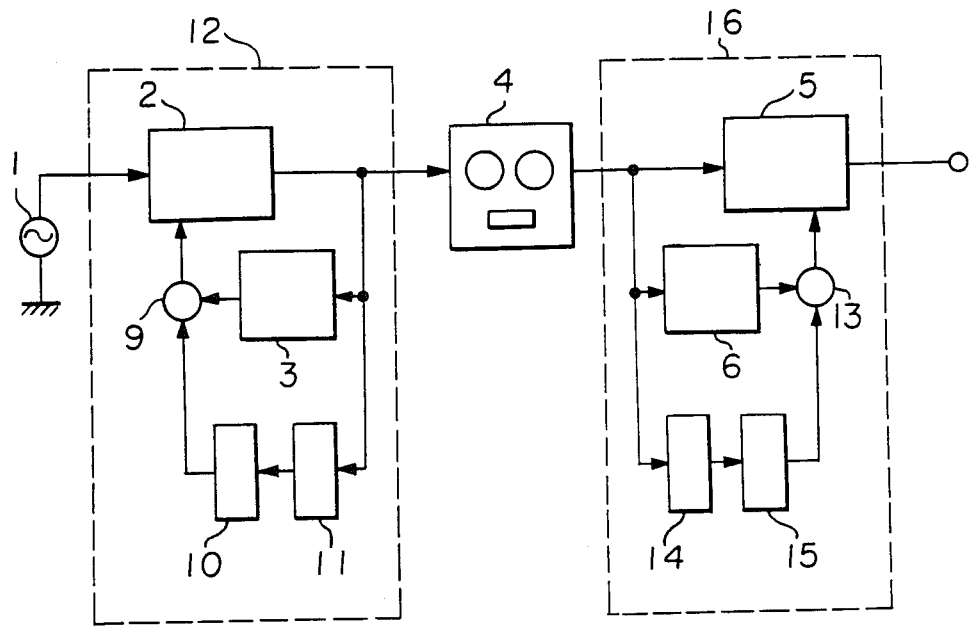
FIG. 3 is a diagram showing an embodiment of the signal processing system according to the present invention.

In FIG. 3, a compressor 12 used for the signal processing system of the present invention is constituted by a voltage controlled amplifier 2, a first detector 3, a combining means 9, a threshold means 10 and a second detector 11.

An expander 16 used for the signal processing system according to the present invention is constituted by a voltage controlled amplifier 5, a third detector 6, a combining means 13, a threshold means 14 and a fourth detector 15.

In the construction as above mentioned, the second detector 11 possesses a second time constant which is shorter than a first time constant obtained by the first detector 3. The output signal from the voltage controlled amplifier 2 is detected by first and second detectors 3, 11. The output of the second detector 11 is received by the threshold means 10 in which a signal component exceeding the threshold level of the threshold means 10 is detected, and the signal component is combined with the output from the first detector 3 by the combining means 9. Thus, the voltage controlled amplifier 2 is controlled by the output of the combining means 9.

Figure 1:
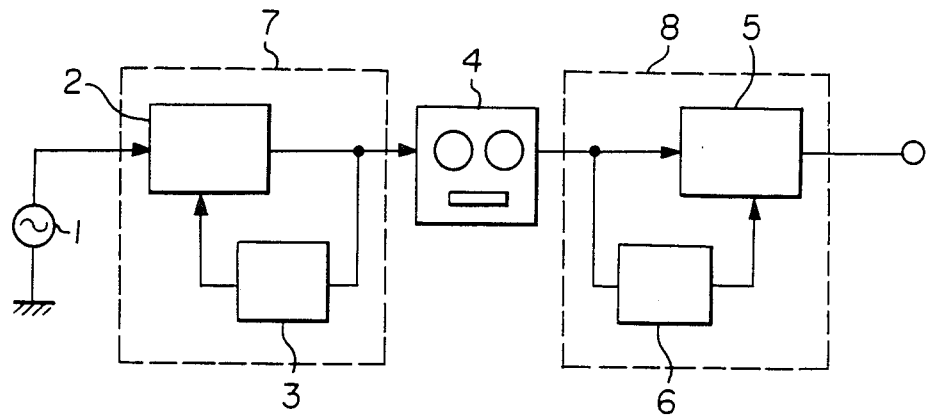
FIG. 1 is a diagram showing a conventional signal processing system.
Figure 2:
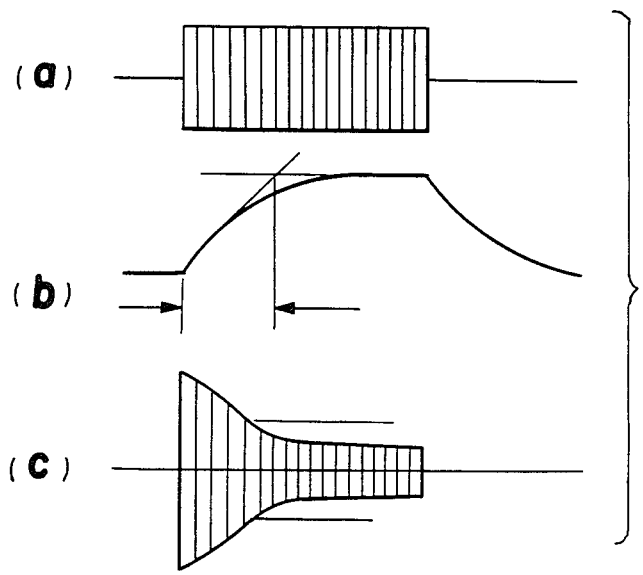
FIG. 2 is a diagram showing the operation of a compressor used for the conventional signal processing system.
Figure 4:
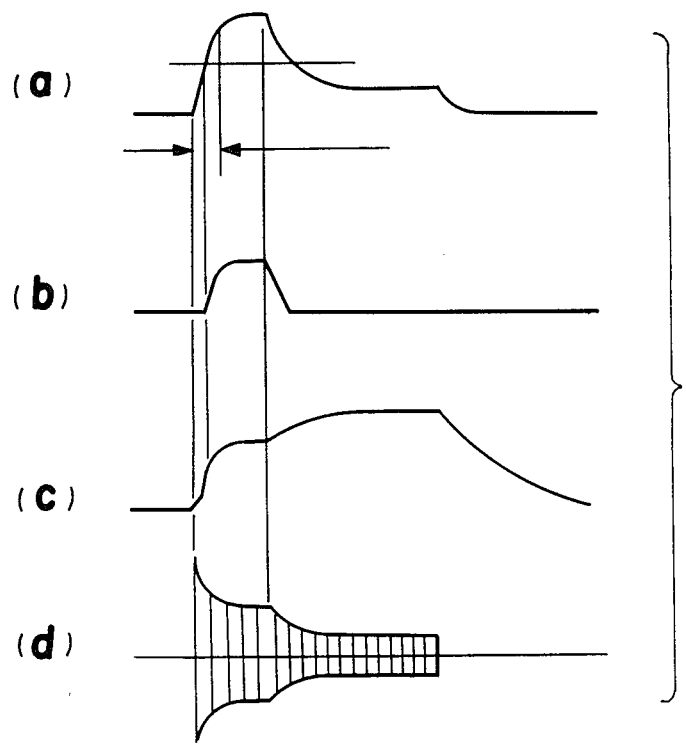
FIG. 4 is a diagram showing the operation of a compressor used for the present invention.

When the input signal of the input signal source 1 is in a tone-burst form as shown in FIG. 2a, the output of the second detector 11 has a rising portion in accordance with the second time constant as shown in FIG. 4a. The output signal of the threshold means 10 has a waveform corresponding to a portion of the signal exceeding the threshold level as shown in FIG. 4b. The output of the second detector 11 is combined with the output of the first detector 3 by the combining means 9. The waveform of the composite signal is shown in FIG. 4c. The rising portion of the waveform is earlier than that of the signal generated from the first detector 3. Accordingly, the output of the voltage controlled amplifier 2, namely, the output signal of the compressor 12 is compressed earlier than the signal from the first detector in the conventional system, as shown in FIG. 4d. The level of the output signal to be compressed is generally determined by the threshold level of the threshold means, and it is possible to select the threshold level in the vicinity of the dynamic range of the tape recorder 4. As the output of the first detector 3 rises, the output of the combining means 9 also rises depending on the output of the first detector 3, whereby compression of the output signal begins again. In compliance with the compression of the output signal, the output of the second detector 11 is reduced.

Thus, by shortening the time exceeding the dynamic range of the tape recorder 4, possibility of occurrence of an abnormal operation such as increase in sound strain, omission of minute sound, clicking sound and so on is reduced. Particularly, since the second detector 11 detects only a 90° section in a rising or falling portion of the output signal of the voltage controlled amplifier 2, the output of the second detector 11 can follow the rising portion of the output signal by taking the frequency of the output signal to be four times or higher than the second time constant. In this case, there is no delay of compression, and the time largely exceeding the dynamic range can be practically eliminated. It is possible to select the second time constant so as to meet the requirement as mentioned above.

By reducing an output component exceeding the dynamic range, occurrence of the abnormal operation is reduced. Such effect can be obtained by selecting the threshold level to be more than the dynamic range in consideration of the output signal.

Further, it is possible for the output signal to be lower than the dynamic range at a time when it is compressed by the second detector 11 by selecting the threshold level to be lower than the dynamic range. However, when the threshold level is determined to be zero, there occurs compression at the second time constant even in normal operation, whereby compatibility of devices for controlling the compression of the signal at the first time constant is impaired. Accordingly, provision of the threshold means 10 is essential.

In the next place, explanation will be made as to operation for reproducing sound. The expander 8 used for the present invention provides further effective function of the reproduction of sound in association with the compressor 12 as described before. Namely, most parts of signals ommitted when they are recorded can be restored by imparting to the expander 16 the action complementary to the action of the compressor for compressing the signals at the second time constant. A reproducing signal from the tape recorder 4 is received in the detector 6 and the threshold means 14. Then, the reproducing signal is converted into a direct current voltage in the detector 6. On the other hand, only a signal component exceeding the threshold level which is equivalent to the threshold means 10 is detected in the threshold means 14, and the detected signal component is supplied to the detector 15. It is preferably that the detector 15 has properties such as the time constant equivalent to the detector 11. The output of the detector 15 is combined with the output of the detector 6 at the combining means 13 so that the combined output controls the amplification factor of the voltage controlled amplifier 5. The combining means 13 also preferably has the properties equivalent to the combining means 10. With the above-mentioned construction, the input signal compressed by the second time constant is expanded by the second time constant.

Figure 6:
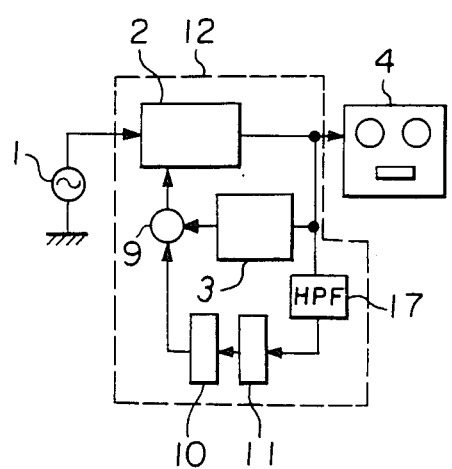
FIGS. 6 to 9 are respectively diagrams showing the second to the fifth embodiments of the compressor according to the present invention.

In the above-mentioned embodiment, the output of the voltage controlled amplifier 2 is used as the input to the second detector 11. However, modification may be made in such a manner that the output of the voltage controlled amplifier 2 is supplied to the second detector 11 through a high-pass filter 17 as shown in FIG. 6. In this modified embodiment, a signal detection is carried out with a high frequency range emphasized, whereby delay in the compression of the signal in the high frequency region can be improved. Thus, it is not always necessary to use the output signal of the voltage controlled amplifier 2 as an input signal to the second detector 11, but any input signal may be used as far as the dynamic range is related to the threshold level.

Figure 7:
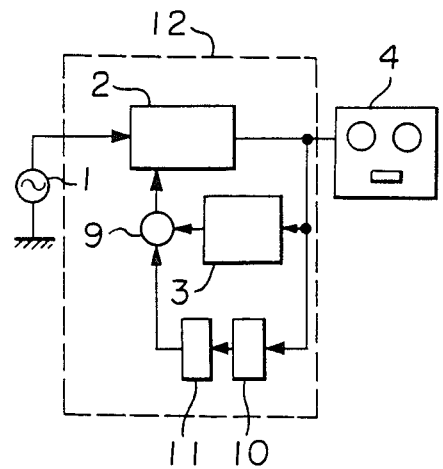

As another modification of the present invention, the second detector 11 can be exchanged with the threshold means 10 as shown in FIG. 7. Namely, the output of the voltage controlled amplifier 2 is supplied to the second detector 11 through the threshold means 10, and the output of the second detector 11 is supplied to the combining means 10. Further, it is possible to operate the threshold means 10, the second detector 11, the combining means 9 and the first detector 3 together.

Figure 5:
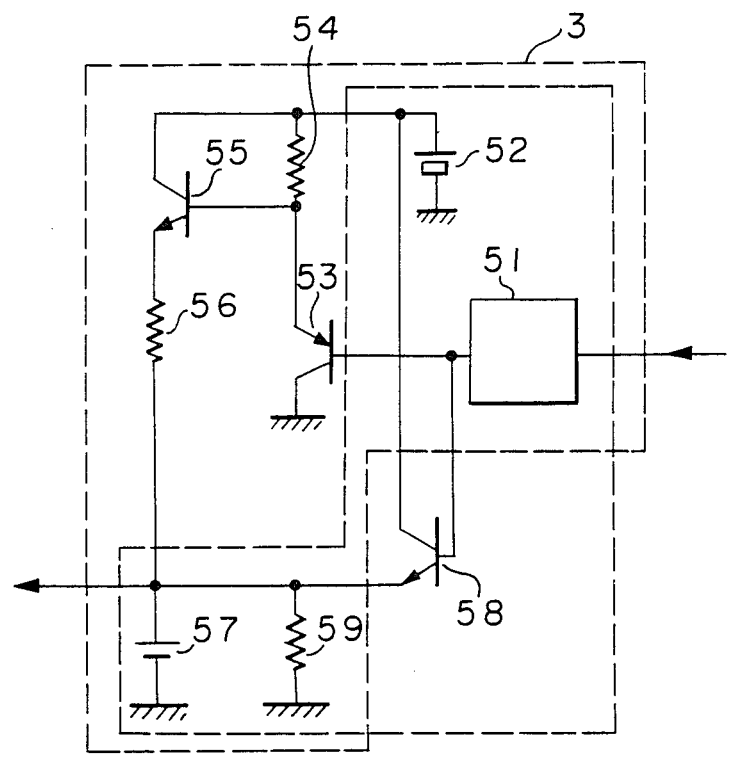
FIG. 5 is a diagram showing an important part of the compressor used for the present invention.

FIG. 5 shows a circuit for obtaining the output of the combining means 9 by receiving the output signal of the compressor 12. In FIG. 5, a reference numeral 51 designates an absolute value circuit. The output of the absolute value circuit 51 is added with a direct current voltage of 0.6 volt at a transistor 53, and the output with the sum value is supplied to the base of a transistor 55. An emitter current is supplied from a power source 52 through a resistor 54 to the transistor 53. A voltage obtained by subtracting a direct current voltage of 0.6 V by the base of the transistor 55 appears at the emitter of the transistor 55. A capacitor 57 is charged by the output from the emitter of the transistor 55 through a resistor 56. The first time constant is determined by the values of the resistor 56 and the capacitor 57.

When the output of the absolute value circuit 51 is lower then the potential of the capacitor 57, the transistor 55 is turned off, whereby an electric charge in the capacitor 57 is discharged through a resistor 59. Thus, the above-mentioned elements constitute the first detector 3.

On the other hand, a transistor 58 co-operates with the first detector 3. Namely, when the output of the absolute value circuit 51 exceeds 0.6 V, the transistor 58 is turned on to charge the capacitor 57 by an emitter current. The voltage value of 0.6 V constitutes a threshold level. Accordingly, the dynamic range is related to the threshold level by the output signal level of the compressor 12 and the gain of the absolute value circuit 51.

The second time constant is determined by the resistor 59 (which constitutes an emitter resistor and usually has a resistance of several tens ohms) and the capacitor 57. The value of the second time constant may be smaller than that of the first time constant.

Figure 8:
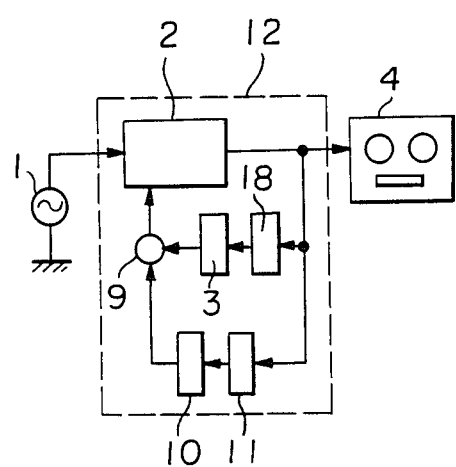

FIG. 8 shows another embodiment of the present invention. In FIG. 8, the output signal of the compressor 12 is inputted into the first detector 3 through a high-pass filter 18.

Figure 9:
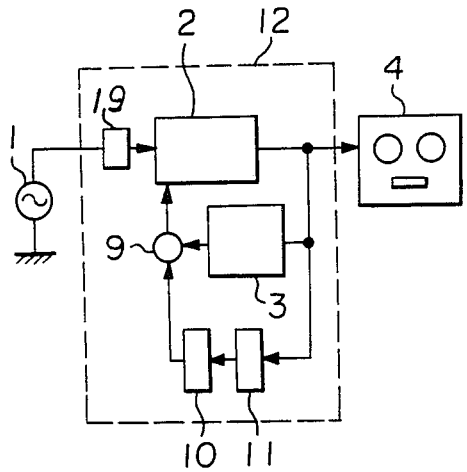

FIG. 9 shows still another embodiment of the present invention in which an input signal from the input signal source 1 is inputted in the voltage controlled amplifier 2 through a pre-emphasis device 19.

Figure 10:
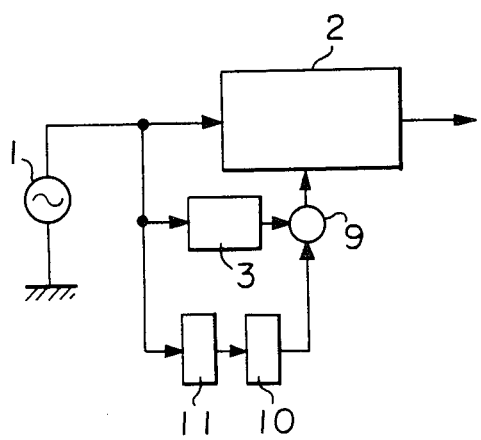
FIGS. 10 and 11 are respectively diagrams showing other embodiments of the compressor according to the present invention. Preferred embodiments of the present invention will be described with reference to the accompanying drawings.
Figure 11:
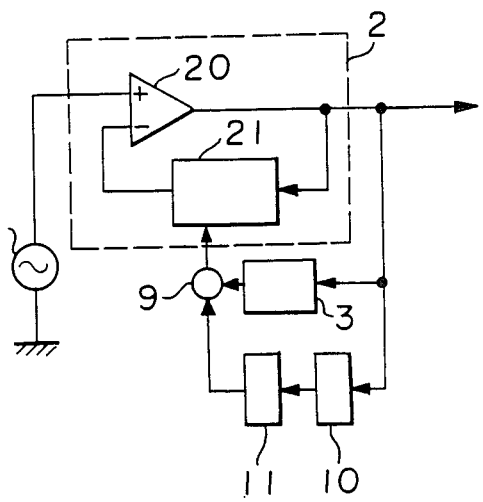

FIGS. 10 and 11 show other embodiments of the present invention. In FIGS. 10 and 11, the same reference numerals designate the same or corresponding parts.

In FIG. 10, the output of the first detector 3 corresponding to the amplitude of an input signal from the input signal source 1 can be obtained. The output of the first detector 3 reduces the amplification factor of the voltage controlled amplifier 2 to thereby compress the dynamic range. In the embodiment shown in FIG. 11, the voltage controlled amplifier 2 comprises an operational amplifier 20 and a voltage controlled amplifier 21. An input signal is inputted in the positive terminal of the operational amplifier 20. The output of the operational amplifier 20 is supplied to the voltage controlled amplifier 21 having an amplification factor in proportion to the controlled voltage. The output of the voltage controlled amplifier 21 is supplied to the negative terminal of the operational amplifier 20. The transfer function of the entire construction shown in FIG. 11 is in a reciprocal relation to the transfer function of a feed-back circuit, namely, the transfer function of the voltage controlled amplifier 21. Accordingly, the voltage controlled amplifier 2 has an amplification factor which is in inverse proportion to the controlled voltage. Thus, the sound signals in the tape recorder is effectively reproduced by the expander 16 having a circuit and function which are in complementary to those of the compressor 12.

In the above-mentioned embodiments, description has been made as to use of a tape recorder as the load. However, the present invention is applicable to a tape recorder of an alternating current bias recording system, an FM recording system or a PCM recording system. In the alternating current bias recording system tape recorder, there is found a gentle increase of strain over the dynamic range. However, in the FM recording system tape recorder, the side band region of an FM wave is broad. In a stereo type tape recorder, for instance, noises are caused by interference in the mutual band regions. When the amplitude of the input of the tape recorder, namely, the amplitude of the output signal of the compressor is limited to suppress production of the noises, sound strain is remarkably increased, whereby there is a great problem when the output exceeds the dynamic range. The present invention is very effective to eliminate such problem.

In the PCM recording type tape recorder, when the output exceeds the dynamic range in an A/D conversion, it is treated as it's having the maximum amplitude, this being regarded as restriction of the amplitude. Accordingly the sound strain is remarkably increased. The effect obtained by application of the present invention is also great.

As described above, in accordance with the present invention, a signal component related to an output signal is detected by the second detector having the second time constant which is shorter than the first time constant of the first detector; the detected output having a sharp rising portion is combined with the output detected by the first detector, and the amplification factor of the voltage controlled amplifier is controlled by the combined output. Accordingly, delay in the compression of the input signal caused by the voltage controlled amplifier is avoidable. Accordingly, an abnormal operation such as increase of sound strain, omission of a minute sound, production of click noises can be prevented.

In accordance with the present invention, a signal which is detected by the second detector to be inputted to the combining means is a signal component which exceeds the threshold level by the slicing function of the threshold means. Accordingly, a conventional system can be utilized in the case below the threshold level.

I claim:

1. A signal processing system comprising a load and a compressor for compressing the dynamic range of an input signal to supply a compressed signal to said load, wherein said compressor comprises:
    (a) an amplifying means for amplifying said input signal,
    (b) a first detecting means having a first integrating time constant for receiving an output signal from said amplifying means and outputting a first detecting signal,
    (c) a second detecting means having a second integrating time constant which is less than said first integrating time constant and including a voltage threshold means which detects said output signal from said amplifying means, said second detecting means outputting a signal exceeding a predetermined voltage threshold level, and
    (d) a combining means for combining signals outputted from both said first and second detecting means to output a composite signal to control said amplifying means, whereby the amplification factor of said amplifying means is changed.

2. The signal processing system according to claim 1, wherein said second detecting means for said compressor comprises a detector, having said second time constant, for detecting said output signal from said amplifying means and generating a detector output signal and said threshold means for detecting only a signal component exceeding said predetermined voltage threshold level of said detected signal generated from said detector.

3. The signal processing system according to claim 1, wherein said second detecting means for said compressor comprises said threshold means to detect a signal component exceeding said predetermined voltage threshold level of said output signal generated from amplifying means and to output a threshold means signal, and a detector having said second time constant to detect said output signal from said threshold means.

4. The signal processing system according to claim 1, wherein said first and second detecting means respectively have an integration circuit.

5. The signal processing system according to claim 1, wherein said first detecting means comprises an absolute value circuit having an input receiving the output signal from said amplifying means and providing an output which is fed to a first transistor which is powered by a D.C. power supply, said first transistor having an output signal which is fed to an input of a second transistor which also powers said second transistor wherein the output of said second transistor is fed to a combination of a first resistor and a first capacitor.

6. The signal processing system according to claim 1, wherein said second detecting means comprises a D.C. power source and an absolute value circuit having an input for receiving the output signal from said amplifying means wherein the output of said power source and the output of said absolute value circuit is fed to the input of a third transistor whose output is fed to a combination of a capacitor and a resistor.

7. The signal processing system according to claim 1, wherein said first detecting means comprises a high-pass filter.

8. The signal processing system according to claim 1, wherein said second detecting means comprises a high-pass filter.

9. A signal processing system comprising a load and a compressor for compressing the dynamic range of an input signal to supply compressed signal to said load, wherein said compressor comprises:
    (a) an amplifying means for amplifying said input signal,
    (b) a first detecting means having a first integrating time constant for detecting said input signal to be supplied to said amplifying means and outputting a first detecting signal,
    (c) a second detecting means having a second integrating time constant which is less than said first integrating time constant and including a voltage threshold means which detects said input signal to be inputted into said amplifying means, said second detecting means outputting a second detecting means signal exceeding a predetermined voltage threshold level, and
    (d) a combining means for combining signals outputted from both said first and second detecting means to output a composite signal to control said amplifying means, whereby the amplification of said amplifier is changed.

10. A signal processing system comprising a load and an expander for expanding the dynamic range of an input signal outputted from said load, wherein said expander comprises:
    (a) an amplifying means for amplifying said input signal,
    (b) a first detecting means having a first integrating time constant for receiving said input signal to output a first detecting signal,
    (c) a second detecting means having a second integrating time constant which is less than said first integrating time constant and including a voltage threshold means which detects said input signal, said second detecting means outputting a second detecting means signal exceeding a predetermined voltage threshold level, and
    (d) a combining means for combining signals outputted from both said first and second detecting means to output a composite signal to control said amplifying means, whereby the amplification factor of said amplifying means is changed.

11. The signal processing system according to claim 10, wherein said second detecting means for said expander comprises a detector having said second time constant for detecting said input signal to be inputted into said amplifying means and generating a detector signal and said threshold means for detecting only a signal component exceeding said predetermined voltage threshold level of said detected signal generated from said detector.

12. The signal processing system according to claim 10, wherein said second detecting means for said expander comprises said threshold means to detect a signal component exceeding said predetermined voltage threshold level of said input signal to be inputted into said amplifying means and outputting a threshold signal and a detector having said second time constant to detect an output signal from said threshold means.

13. A signal processing system according to claim 10, wherein said first and second detecting means respectively have an integration circuit.

14. A signal processing system according to claim 10, wherein said threshold means comprises a high-pass filter.

15. The signal processing system according to claim 10, wherein said first detecting means comprises a high-pass filter.

* * * * *